(12) United States Patent
Wu (10) Patent No.: US 10,693,466 B2
(45) Date of Patent: Jun. 23, 2020

(54) SELF-ADAPTIVE CHIP AND CONFIGURATION METHOD

(71) Applicants: Guosheng Wu, Qingdao (CN); Qingdao Robei Electric Co., Ltd., Qingdao (CN)

(72) Inventor: Guosheng Wu, Qingdao (CN)

( * ) Notice: Subject to any disclaimer, the term of this patent is extended or adjusted under 35 U.S.C. 154(b) by 123 days.

(21) Appl. No.: 15/748,938

(22) PCT Filed: Jul. 31, 2015

(86) PCT No.: PCT/CN2015/085701
§ 371 (c)(1),
(2) Date: Jan. 30, 2018

(87) PCT Pub. No.: WO2017/020165
PCT Pub. Date: Feb. 9, 2017

(65) Prior Publication Data
US 2019/0007049 A1    Jan. 3, 2019

(51) Int. Cl.
*H03K 19/17752* (2020.01)
*G06F 15/177* (2006.01)
*G06F 7/57* (2006.01)
*H03K 19/17728* (2020.01)
(Continued)

(52) U.S. Cl.
CPC ......... *H03K 19/17752* (2013.01); *G06F 7/57* (2013.01); *G06F 15/177* (2013.01); *H03K 19/1774* (2013.01); *H03K 19/17728* (2013.01); *G06F 30/34* (2020.01)

(58) Field of Classification Search
None
See application file for complete search history.

(56) References Cited

U.S. PATENT DOCUMENTS 5,519,811 A    5/1996  Yoneda et al.
7,196,541 B2   3/2007  Nowak-Leijten
(Continued)

FOREIGN PATENT DOCUMENTS

CN    102236632 A    11/2011
CN    102279753 A    12/2011
(Continued)

OTHER PUBLICATIONS

Govindaraju et al., "DySER: Unifying Functionality and Parallelism Specialization for Energy-Efficient Computing," IEEE Computer Society (2012); 38-51.
(Continued)

*Primary Examiner* — Michael D. Yaary (57) ABSTRACT

Disclosed are a self-adaptive chip (100) and configuration method. The self-adaptive chip includes: a plurality of dynamically reconfigurable cells arranged in an array, each of the plurality of dynamically reconfigurable cells being capable of being dynamically reconfigured as needed to execute different operating functions and/or input-output control functions, wherein, each of the plurality of dynamically reconfigurable cells is connected to multiple neighboring dynamically reconfigurable cells, to acquire data from one or more of the multiple neighboring dynamically reconfigurable cells, and output an operation result based on the data to at least one neighboring dynamically reconfigurable cell.

19 Claims, 7 Drawing Sheets

(51) Int. Cl.
*H03K 19/17736* (2020.01)
*G06F 30/34* (2020.01)

(56) References Cited

U.S. PATENT DOCUMENTS

| | | | | |
|---|---|---|---|---|
| 7,237,087 B2* | 6/2007 | Vorbach | ................... | G06F 1/12 |
| | | | | 712/15 |
| 7,568,084 B2 | 7/2009 | Tanaka et al. | | |
| 7,595,659 B2* | 9/2009 | Vorbach | .............. | G06F 15/7867 |
| | | | | 326/38 |
| 8,076,955 B2* | 12/2011 | Danilin | ............ | H03K 19/17728 |
| | | | | 326/38 |
| 2009/0077153 A1* | 3/2009 | Dobbelaere | ............. | G06F 7/724 |
| | | | | 708/520 |

FOREIGN PATENT DOCUMENTS

| | | |
|---|---|---|
| CN | 102306141 A | 1/2012 |
| CN | 102567279 A | 7/2012 |
| CN | 102662765 A | 9/2012 |
| CN | 103942181 A | 7/2014 |
| JP | 2005044329 A | 2/2005 |
| JP | 2006053687 A | 2/2006 |
| JP | 2006519548 A | 8/2006 |
| JP | 2010211496 A | 9/2010 |

OTHER PUBLICATIONS

Kim et al., "Memory Access Optimization in Compilation for Coarse-Grained Reconfigurable Archtectures," ACM Transactions on Design Automation of Electronic Systems (2011); 16(4):1-27.

\* cited by examiner

SELF-ADAPTIVE CHIP AND CONFIGURATION METHOD

CROSS-REFERENCE TO RELATED APPLICATION

This application is the 371 application of PCT Application No. PCT/CN2015/085701, filed Jul. 31, 2015, the entire contents of which are incorporated herein by reference.

TECHNICAL FIELD

The present disclosure relates to a chip and an electronic device, and more particularly, to a self-adaptive chip, a configuration method thereof, and an electronic device having the self-adaptive chip.

BACKGROUND

The development of science and technology has put forward increasingly higher requirements for chip designing and manufacturing. A system on chip (SoC), which is technically supported by adopting IP core reuse and software/hardware co-verification thereof, has become the mainstream method for designing high performance integrated circuits. It has also been evolved into a huge system engineering from the chip system definition, front-end circuit design, back-end physical implementation, chip manufacturing, packing and testing to software development and then to the final mass production. At present, the mainstream chips are still ASIC and FPGA chips.

The ASIC is an integrated circuit designed and manufactured in response to the requirements of a specific user and the needs of a specific electronic system. Compared with a general integrated circuit, the ASIC in batch production has the advantages of small size and low power consumption, but the ASIC is not a reconfigurable chip, has a longer time to market, and also needs tape-out. The expense for one-time tape-out is very high, and the cost can be reduced only in the case of large amount.

The FPGA is based on the ASIC, and its basic principle is to use an LUT (Lookup Table). The LUT is essentially a memory table. Data is written into the memory table in advance. When a signal is inputted in each time, it is equivalent to entering an address to look up the table to find contents corresponding to the address, and then output the contents. The FPGA allows the chip structure to be reconfigured in a static state, and even be reconfigured in a locally dynamic state. The FPGA has an obvious advantage over the ASIC on the time-to-market; however, a designed circuit still needs to be written into the chip in general. The application cost of the FPGA for a small quantity is relatively low, but is relatively high for a large quantity.

The ASIC has fixity. Once the ASIC is completely designed, the chip functions thereof are fixed. Unless the chip is damaged, the functions of the ASIC will not be changed. This chip can only adapt to a specific function, but cannot change with different requirements, and it is basically impossible to update hardware. If the chip is designed for a satellite, once the satellite arrives in space, it will cost a lot to upgrade the hardware.

Although the FPGA corporation may provide some configurable chips, because the way of look-up table is used, it is necessary to calculate all the possible data before writing data into the chip, and then write the huge data to each lookup table. In this way, as the configuration data increases, the time for writing the data into the FPGA will be longer and longer. Even if local reconfiguration is possible, the FPGA cannot be reconfigured at a super-fast speed because the reconfiguration speed is greatly limited due to the huge amount of the configured data.

With the increase of the chip scale and design complexity, the reconfiguration time of the chip is becoming longer and longer. It is very difficult to use the existing FPGA technology to realize dynamic real-time reconstruction.

Therefore, it is necessary to design a self-adaptive chip that can realize the dynamic reconfiguration function and realize the function of multi-purpose for one-chip.

The above information disclosed in the background section is only for enhancement of understanding of the background of the disclosure and therefore it may contain information that does not form the prior art that is already known to those having ordinary skills in the art.

SUMMARY

The present disclosure discloses a self-adaptive chip and a configuration method thereof, and an electronic device having the self-adaptive chip. The self-adaptive chip according to the present disclosure can be fast reconfigured in a dynamic manner.

Other characteristics and advantages of the present disclosure will become apparent from the following detailed description, or may be partially learned by practice of the present disclosure.

According to an aspect of the present disclosure, there is provided a self-adaptive chip, including: a plurality of dynamically reconfigurable cells arranged in an array, each of the plurality of dynamically reconfigurable cells being capable of being dynamically reconfigured as needed to execute different operating functions and/or input-output control functions, wherein, each of the plurality of dynamically reconfigurable cells is connected to multiple neighboring dynamically reconfigurable cells, to acquire data from one or more of the multiple neighboring dynamically reconfigurable cells, and output an operation result based on the data to at least one neighboring dynamically reconfigurable cell.

According to some embodiments, each of the plurality dynamically reconfigurable cells is connected to four to eight neighboring dynamically reconfigurable cells.

According to some embodiments, each of the plurality dynamically reconfigurable cells includes an arithmetic logic time cell, and the arithmetic logic time cell is configured to achieve at least one of an arithmetic operation, a logical operation, an empty operation, a timing delay and counting.

According to some embodiments, each of the plurality of dynamically reconfigurable cells implements a software algorithm function by being configured into a corresponding circuit structure.

According to some embodiments, each of the plurality dynamically reconfigurable cell further includes: a memory/register, an input controller and an output controller.

According to some embodiments, the arithmetic logic time cell is configured to execute different operating functions according to instructions.

According to some embodiments, an execution cycle of each instruction is at least one clock.

According to some embodiments, the self-adaptive chip is configured to implement a cascade of operations through a cascade of the dynamically reconfigurable cells so as to implement more instructions.

According to some embodiments, the arithmetic logic time cell comprises: a clock input terminal, a reset terminal, a plurality of instruction input terminals, a plurality of operation input terminals, and a plurality of operation output terminals.

According to some embodiments, the plurality of operation input terminal includes: a plurality of source operand input terminals, a plurality of destination operand input terminals and a carry input terminal.

According to some embodiments, the plurality of operation output terminals comprise: an output result low-bit output terminal, an output result high-bit output terminal and a flag bit output terminal.

According to some embodiments, the input controller is configured to control data sources of the plurality of operation input terminals.

According to some embodiments, the data source is at least one of the multiple neighboring dynamically reconfigurable cells or the memory/register.

According to some embodiments, the output controller is configured to output data from the plurality of operation output terminals to at least one of the multiple neighboring dynamically reconfigurable cells in a single and/or combined manner.

According to some embodiments, the memory/register is used for registering data involved in the operation.

According to some embodiments, the memory/register is used for registering an instruction, an operand and configuration data of the input controller, and the configuration data is used for controlling a data source of the input controller.

According to some embodiments, the memory/register is provided with independent data channels for respectively inputting an operating instruction, the configuration data of the input controller and operation data which may be registered, from a top level.

According to some embodiments, the self-adaptive chip implements an algorithm of serial operation in a pipeline or parallel manner.

According to some embodiments, the self-adaptive chip comprises: an address input terminal and an address control cell, and the address control cell selects one of the plurality of dynamically reconfigurable cells through the address input terminal to perform configuration.

According to some embodiments, the self-adaptive chip is configured to perform following processing: after being configured for one time, the self-adaptive chip performs an operation according to inputted data; and after this operation is completed, the self-adaptive chip is erased and reconfigured, and then performs a new operation according to new inputted data; such processing is repeated.

According to some embodiments, the self-adaptive chip is divided into at least two operation regions, and the at least two operation regions are configured and performs the operation in parallel, so as to implement a parallel processing.

According to another aspect of the present disclosure, there is provided a configuration method which may be used for any of the forgoing self-adaptive chip, including: defining a plurality of configurations respectively used for the plurality of dynamically reconfigurable cells, each of the plurality of configurations comprising at least one configuration parameter value; and writing the plurality of configurations into corresponding plurality of dynamically reconfigurable cells respectively.

According to some embodiments, the defining the plurality of configurations respectively used for the plurality of dynamically reconfigurable cells comprises: compiling a predetermined operation into a structure comprising the plurality of dynamically reconfigurable cells, each dynamically reconfigurable cell being configured to complete at least one operation.

According to some embodiments, the writing the plurality of configurations into the corresponding plurality of dynamically reconfigurable cells respectively comprises: selecting one of the plurality of dynamically reconfigurable cells and writing the at least one configuration parameter value of the corresponding configuration into one of the plurality of dynamically reconfigurable cells.

According to another aspect of the present disclosure, there is provided an electronic device used for executing at least a first function and a second function, wherein the electronic device may include any one of the foregoing self-adaptive chips. When the first function is to be executed or being executed, the self-adaptive chip is dynamically configured for executing part or all of the first function; and when the first function is completely executed while the second function is to be executed or being executed, the self-adaptive chip is dynamically configured for executing part or all of the second function.

The self-adaptive chip according to some embodiments of the present disclosure can implement infinite circuit algorithms in a finite chip area by reconfiguring the chip automatically at different time points.

The self-adaptive chip according to some embodiments of the present disclosure can adjust the internal structure of the chip automatically according to different application requirements, so as to implement dynamic reconfiguration, infinite chip area, less power consumption and low cost.

All logic cells of the self-adaptive chip according to some embodiments of the present disclosure can be reused since the chip can be dynamically re-erased; therefore, the logic cells become infinite, and are not limited any longer. The self-adaptive chip is only limited by a re-erasing speed, and is not limited by the capacity.

The self-adaptive chip according to some embodiments of the present disclosure can conduct configuration and operation in different regions, and implement synchronous configuration and operation; moreover, the time for switching configuration can reach a nanosecond level after the operation is completed.

It is to be understood that both the foregoing general description and the following detailed description are exemplary only, and not restrictive of the disclosure.

BRIEF DESCRIPTION OF THE DRAWINGS

The above and other characteristics and advantages of the present disclosure will become more obvious by describing the exemplary embodiments in detail with reference to the accompanying drawings.

DETAILED DESCRIPTION

The exemplary embodiments will now be described more fully with reference to the accompanying drawings. The exemplary embodiments may, however, be embodied in many forms and should not be construed as being limited to the exemplary embodiments set forth herein; rather, these exemplary embodiments are provided to make this disclosure thorough and complete, and to fully convey the concepts of the exemplary embodiments to those skilled in the art. In the drawings, the same reference numerals denote the same or similar parts, and a repetitive description thereof will be omitted.

Furthermore, the described characteristics, structures, or properties may be combined in any suitable manner in one or more embodiments. In the following description, a number of specific details are provided to give a full understanding of the embodiments of this disclosure. However, it will be appreciated by those skilled in the art that the technical solution of the disclosure can be practiced without one or more of the specific details, or using other methods, constituent elements, modules, steps and so on. In other cases, well-known structures, methods, apparatuses, implementations, modules, or operations are not shown or described in detail to avoid obscuring aspects of the disclosure.

The block diagram shown in the drawings is only a functional entity, and does not necessarily have to correspond to a physically independent entity. That is, these functional entities can be implemented in various forms, or these functional entities can be implemented in one or more hardware modules or circuit cells.

Figure 1:
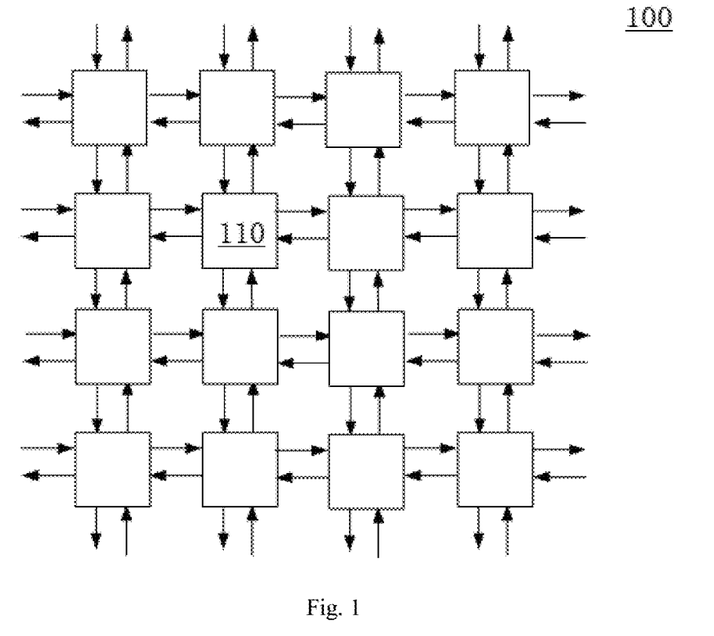
FIG. 1 illustrates a schematic diagram of a self-adaptive chip according to some exemplary embodiments of the present disclosure.

FIG. 1 illustrates a schematic diagram of a self-adaptive chip according to an exemplary embodiment of the present disclosure.

As shown in FIG. 1, a self-adaptive chip 100 includes multiple basic cells, i.e., dynamically reconfigurable cells 110. The dynamically reconfigurable cells 110 are arranged in an array form, and each dynamically reconfigurable cell 110 is connected to multiple neighboring dynamically reconfigurable cells 110. As described below, each dynamically reconfigurable cell 110 may be dynamically reconfigured with different operating functions and/or input-output functions as required. Each dynamically reconfigurable cell 110 obtains data from one or more of neighboring dynamically reconfigurable cells 110, and may output an operation result based on these data to at least one neighboring dynamically reconfigurable cell.

FIG. 1 illustrates that each dynamically reconfigurable cell 110 is connected to four neighboring dynamically reconfigurable cells 110, but the present disclosure is not limited to this. For example, each dynamically reconfigurable cell 110 may be connected to four to eight, or even more neighboring dynamically reconfigurable cells 110.

For each dynamically reconfigurable cell 110 as shown in FIG. 1, data may be inputted and outputted from four different directions, i.e., the data may be inputted from four different neighboring dynamically reconfigurable cells 110, and after operation, results may be outputted to the four different neighboring dynamically reconfigurable cells 110 for further calculation, and so on, so as to dynamically construct an operation network. The dynamically reconfigurable cell 110 implements a software algorithm function by being configured into a corresponding circuit structure.

The self-adaptive chip 100 performs an operation according to the inputted data after being configured one time. After the operation is completed, the self-adaptive chip may be erased and reconfigured, and then performs a new operation based on the new inputted data. The above steps are repeated, so as to achieve the effect of infinite chip area.

The self-adaptive chip according to the present disclosure includes a plurality of basic cells (dynamically reconfigurable cells). Configuration data may be registered in each basic cell, and each basic cell is connected to the neighboring basic cell. Each basic cell obtains data from one or more neighboring basic cells according to the configuration, and may output an operation result based on these data to at least one neighboring basic cell. When the data is transmitted to the basic cell, an operation is performed according to the configuration. Therefore, the present disclosure provides a novel chip, which can be dynamically reconfigured, and can implement infinite circuit algorithms in a finite chip area by reconfiguring the chip automatically at different time points. Moreover, the internal structure of the chip may be automatically adjusted according to different application requirements, so as to implement dynamic reconfiguration, less power consumption and low cost.

As described above, the self-adaptive chip according to the present disclosure can perform various inputs, outputs and operations according to the configuration, so that the transformation from a software algorithm to the chip structure directly can be rapidly implemented. The self-adaptive chip has obvious advantages over an LUT structure adopted by the FPGA. The FPGA suffers from a large amount of configuration data in terms of dynamic reconfigurability, thus the dynamic reconfiguration speed of the FPGA is difficult to be improved, and can only reach a millisecond level. The self-adaptive chip according to the present disclosure does not adopt the LUT structure, and can implement fast dynamic reconfiguration. The basic cells of the self-adaptive chip according to the present disclosure can be reused, so that the basic cells become infinite, and will not be limited any longer. The self-adaptive chip is only limited by a re-erasing (configuration) speed, but is not limited by the capacity.

Figure 2:
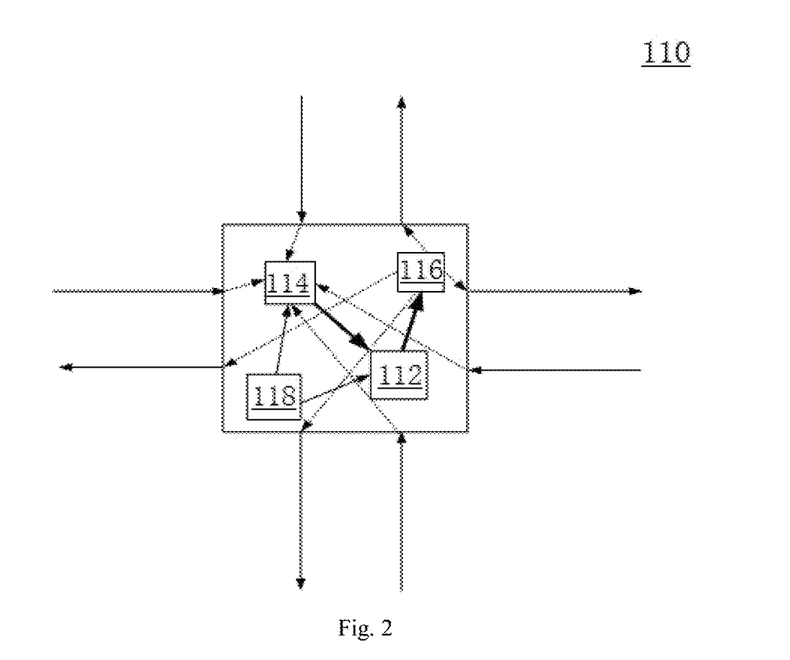
FIG. 2 illustrates a schematic diagram of a dynamically reconfigurable cell used for the self-adaptive chip according to some exemplary embodiments of the present disclosure.
Figure 3:
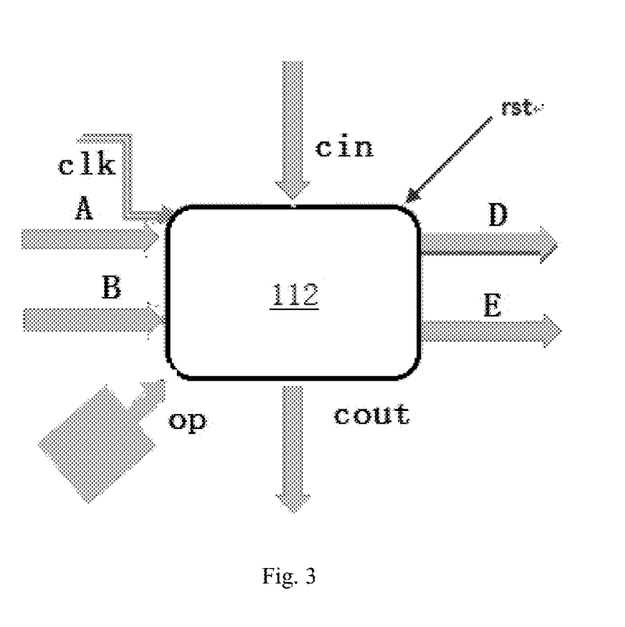
FIG. 3 illustrates an arithmetic logic time cell according to some exemplary embodiments of the present disclosure.
Figure 4:
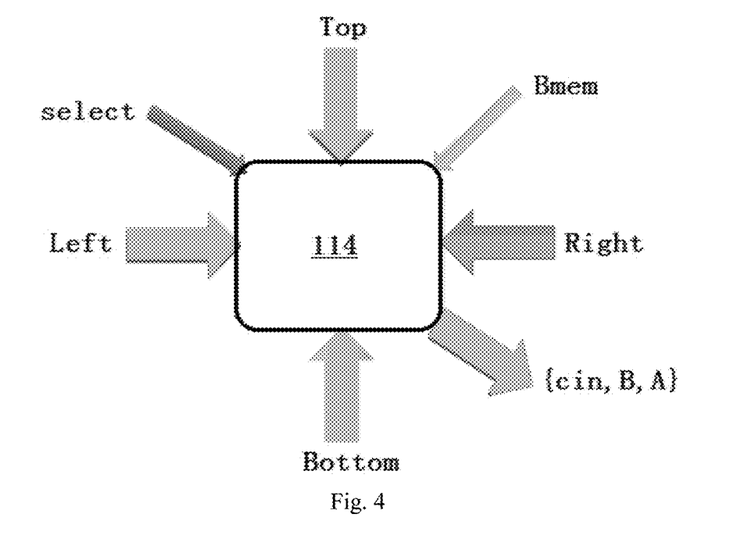
FIG. 4 illustrates an input controller according to some exemplary embodiments of the present disclosure.
Figure 5:
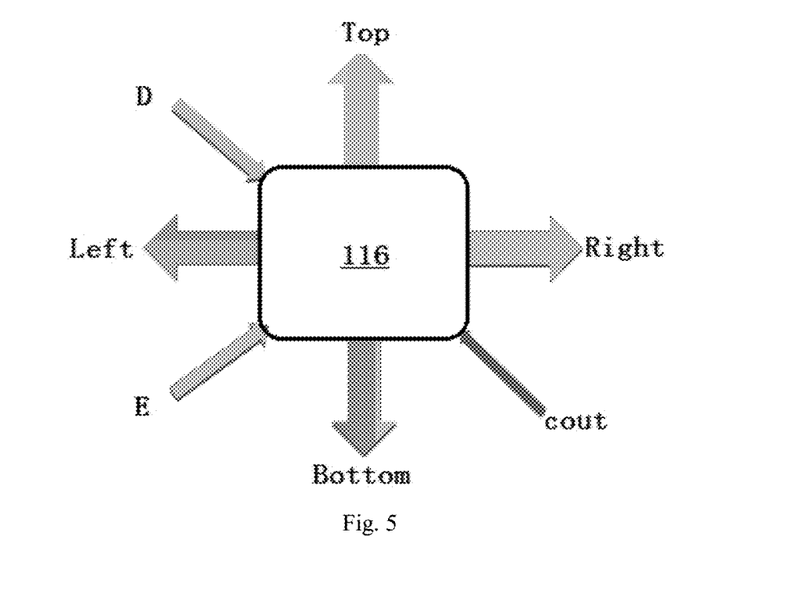
FIG. 5 illustrates an output controller according to some exemplary embodiments of the present disclosure.
Figure 6:
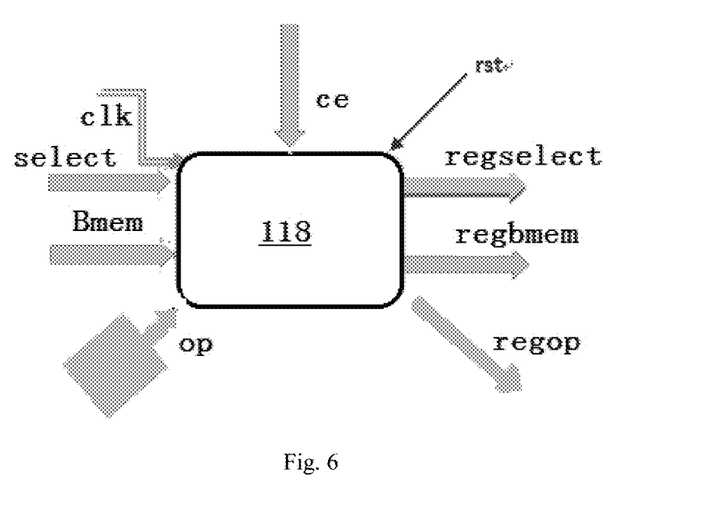
FIG. 6 illustrates a memory/register according to some exemplary embodiments of the present disclosure.

FIG. 2 illustrates a dynamically reconfigurable cell 110 used for the self-adaptive chip 100 according to some exemplary embodiments of the present disclosure. FIG. 3 illustrates an arithmetic logic time sequence cell 112 according to exemplary embodiments of the present disclosure. FIG. 4 illustrates an input controller 114 according to some exemplary embodiments of the present disclosure. FIG. 5 illustrates an output controller 116 according to some exemplary embodiments of the present disclosure. FIG. 6 illustrates a memory/register 118 according to some exemplary embodiments of the present disclosure.

The dynamically reconfigurable cell 110 according to the exemplary embodiments of the present disclosure is described hereinafter with reference to FIGS. 2 to 6.

As shown in FIGS. 2 to 6, the dynamically reconfigurable cell 110 may include the arithmetic logic time cell 112. According to the exemplary embodiments, the dynamically reconfigurable cell 110 may also include the input controller 114, the output controller 116, and the memory/register 118.

The arithmetic logic time cell 112 may include a clock input terminal clk, a reset terminal rst, a plurality of instruction input terminals op, a plurality of operation input terminals and a plurality of operation output terminals. The plurality of operation input terminals may include: a plurality of source operand input terminals A, a plurality of destination operand input terminal B, and an operation auxiliary input terminal cin. The plurality of operation output terminal may include: an output result low-bit output terminal D, an output result high-bit output terminal E and a flag bit output terminal cout.

The input controller 114 may be used for controlling data sources of the plurality of operation input terminals. The data source may be multiple neighboring dynamically reconfigurable cells 110 or the memory/register 118.

The output controller 116 may be used for outputting data from the plurality of operation output terminal to the multiple neighboring dynamically reconfigurable cells 110 in a single and/or combined manner.

The arithmetic logic time cell 112 may execute an arithmetic operation, logical operation, empty operation, timing delay or counting according to the inputted data and configuration, and output an operation result. The data input of the arithmetic logic time cell 112 may be controlled by the input controller 114, and the result output of the arithmetic logic time cell 112 may be controlled by the output controller 116, but the present disclosure is not limited to this.

The memory/register 118 may register data involved in the operation and configuration parameter values. For instance, the memory/register may be used for registering an instructions, an operand and configuration data of the input controller. The configuration data of the input controller may be used for controlling the data source of the input controller 114.

The memory/register 118 may have independent data channels so as to respectively input an instruction, the operand and selected data from a top level.

Referring to FIG. 3, the arithmetic logic time cell (Arithmetic Logic Time Cell: ALTU) 112 according to the exemplary embodiment is mainly responsible for implementing arithmetic operation, logical operation, empty operation, timing delay and counting. The arithmetic logic time cell 112 may implement sixteen different operating functions, including ten logic operating functions, one empty operation, three arithmetic operations and two timing operating functions. Different operating functions are controlled by an input of a 4-bit op.

The bit width and function of each terminal are as shown in Table 1. Referring to FIG. 3, clk is used for a clock input signal, rst is used for a reset signal, op is used for an operation instruction, A, B and cin are used for operation input, while D, E and cout are used for operation output.

FIG. 3 and Table I are shown only to illustrate the technical solutions of the present disclosure, but are not intended to limit the scope of the present disclosure. It is easy to understand that various implementations and modifications can be put forward based on the contents and teachings of the present disclosure, and the present disclosure is not limited to the embodiments disclosed in the description.

TABLE 1

Terminals of arithmetic logic time cell

| Terminal name | Data width (bit) | Function |
|---|---|---|
| clk | 1 | Clock signal |
| rst | 1 | Reset signal, low level reset |
| op | 4 | Operation instruction (refer to instruction set in Table 2) |
| A | 8 | Source operand |
| B | 8 | Destination operand |
| cin | 1 | Input carry |
| D | 8 | Low-bit output result |
| E | 8 | High-bit output result |
| cout | 1 | Output flag bit |

The arithmetic logic time cell 112 according to the exemplary embodiment may be configured to execute various operating functions and operations according to instructions, such as a direct operation, an input and output exchange operation, a bitwise reverse operation, AND and OR operations, logic AND operation, complementary operation, ADC (Add With Carry) operation, delay operation, a counting operation, or the like. The listed are exemplary only, and the present disclosure is not limited thereto.

The arithmetic logic time cell 112 is a core part of each dynamically reconfigurable cell 110, and carries all the operating functions. Each arithmetic logic time cell 112 may execute one of the sixteen instructions, and the execution cycle of each instruction may be one clock cycle. The dynamically reconfigurable cells 110 may be cascaded to implement more instructions. Some instructions may be used as a 16-bit operation, and an 8-bit operation is conducted for a double-operand instruction. An operation exceeding 8 bits may be implemented by cascading multiple dynamically reconfigurable cells 110.

Referring to FIG. 4, the input controller 114 controls data sources of the input terminals A, B and cin of the arithmetic logic time cell 112. Four directions (i.e., neighboring dynamically reconfigurable cells) of the input data are controlled by select, and the four directions may be represented by reference numerals Top, Bottom, Left and Right. Coding modes may be as follows: the coding increases in a clockwise direction, for example, 0 for Top, 1 for Right, 2 for Bottom and 3 for Left. The four directions may be implemented by 2-bit coding, for example, as shown in Table 2.

TABLE 2

Coding form of input controller

| Direction | Decimal system | Binary system |
|---|---|---|
| Top | 0 | 00 |
| Right | 1 | 01 |
| Bottom | 2 | 10 |
| Left | 3 | 11 |

The source directions of the input data of the terminals A, B and cin may be controlled by 2 bits each, with a total of 6 bits. However, the data source of the terminal B may also be inputted through Bmem in the holder in addition to the four directions. Therefore, one more bit is added as the highest bit for select; when this bit is 1, the data source of B is the numerical value of Bmem in the memory/register 118, as shown in table 3.

TABLE 3

| Select control signal | |
|---|---|
| Select signal bit | Control signal input source |
| 1:0 | A |
| 3:2 | B |
| 5:4 | Cin |
| 6 | B or Bmem |

A data path of the dynamically reconfigurable cell 110 mainly depends on the input controller 114. The input controller 114 selects the data sources of the terminals A, B and cin by the select signal, so as to be provided to the arithmetic logic time cell 112 for operation. The data of the terminals A, B and cin may either be derived from the input in the same direction, or be derived from the inputs in different directions.

Referring to FIG. 5, the output controller 116 is a relatively simple controller, which is used for transferring the output result towards four directions. The operation result of the arithmetic logic time cell 112 is inputted to the output controller through cout, D and E, combined by the output controller, and then outputted through four different directions.

Referring to FIG. 6, the memory/register 118 mainly registers three important data involved in operation, i.e., an operator from the terminal op used for controlling the arithmetic logic time cell 112 to perform operation, register operand from the terminal Bmem, and the configuration data from the terminal select used for controlling the data source of the input controller 114. The highest bit of select is used for controlling whether the operand is from the input of the top level or from the output result of the neighboring dynamically reconfigurable cell. When rst is at a low level, the holder is reset, and three data are cleared to zero. When rst and ce are at a high level, data holding starts. The input terminal of each memory/register 118 is directly connected to a data input channel in the top layer; therefore, each of op, Bmem and select has a separate data channel to input signals from the top level rather than inputting signals by direction control. Bmem, op and select are all directly connected to the input terminal at the top layer. When ce is at a high level, input from the top layer is fed in the holder, which keeps unchanged when the data is not rewritten, and is outputted through regselect, regbmem and regop. When the instruction of op is not 0, the input controller may be enabled. The "top layer" here refers to the terminal of the self-adaptive chip, rather than the neighboring cell.

Figure 7:
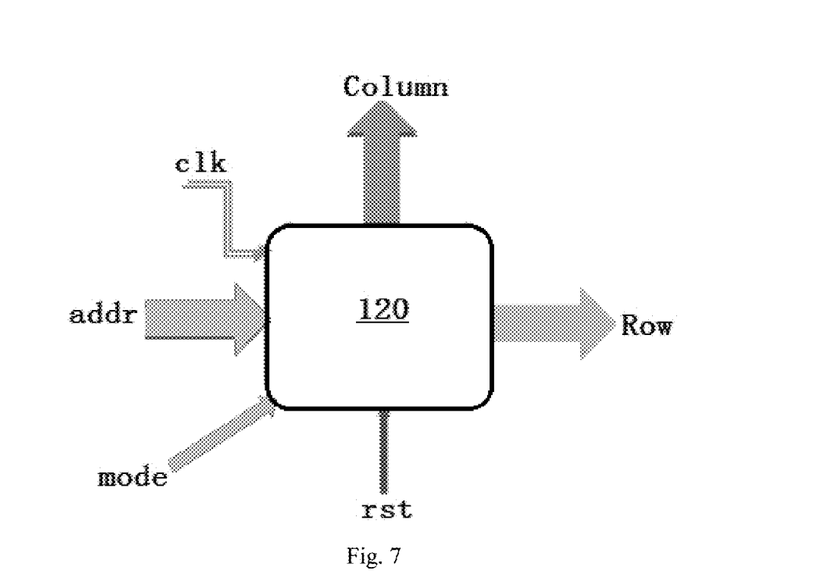
FIG. 7 illustrates an address controller according to some exemplary embodiments of the present disclosure.

FIG. 7 illustrates an address controller 120 according to exemplary embodiments of the present disclosure.

Referring to FIG. 1 and FIG. 7, any dynamically reconfigurable cell 110 may be selected through the address controller 120 to perform configuration, and the dynamically reconfigurable cell 110 after the configuration automatically runs.

As shown in FIG. 7, the address controller 120 has a flag bit terminal mode and an address input terminal addr. When the terminal mode is 1, the address input information is valid; otherwise, it is invalid. By analyzing the address, the address controller 120 analyses the address and decomposes it into row information and column information. Row is used for selecting a row, and Column is used for selecting a column, so that a certain dynamically reconfigurable cell is selected for configuration. However, the present disclosure is not limited to this, and the configuration may be performed in other ways.

For instance, according to some other embodiments, because the arrangement of the basic cells of the self-adaptive chip according to the present disclosure is similar to the pixel arrangement of a liquid crystal or OLED display screen, a similar way of display pixel by pixel may also be used to configure each basic cell, which will not be elaborated herein.

According to some embodiments, when configuring the self-adaptive chip, multiple configurations used for the multiple dynamically reconfigurable cells respectively are defined firstly, each configuration including at least one configuration parameter value; and then the multiple configurations are respectively written into the corresponding multiple dynamically reconfigurable cells.

According to some embodiments, the defining the multiple configurations used for the multiple dynamically reconfigurable cells may include: compiling a predetermined operation (for example, C program) into a structure including the multiple dynamically reconfigurable cells, and each dynamically reconfigurable cell is configured to complete one operation.

According to some embodiments, the respectively writing the multiple configurations into the corresponding multiple dynamically reconfigurable cells may include: selecting one of the multiple dynamically reconfigurable cells, and then writing the at least one configuration parameter value of the corresponding configuration into said one of the multiple dynamically reconfigurable cells.

Figure 8:
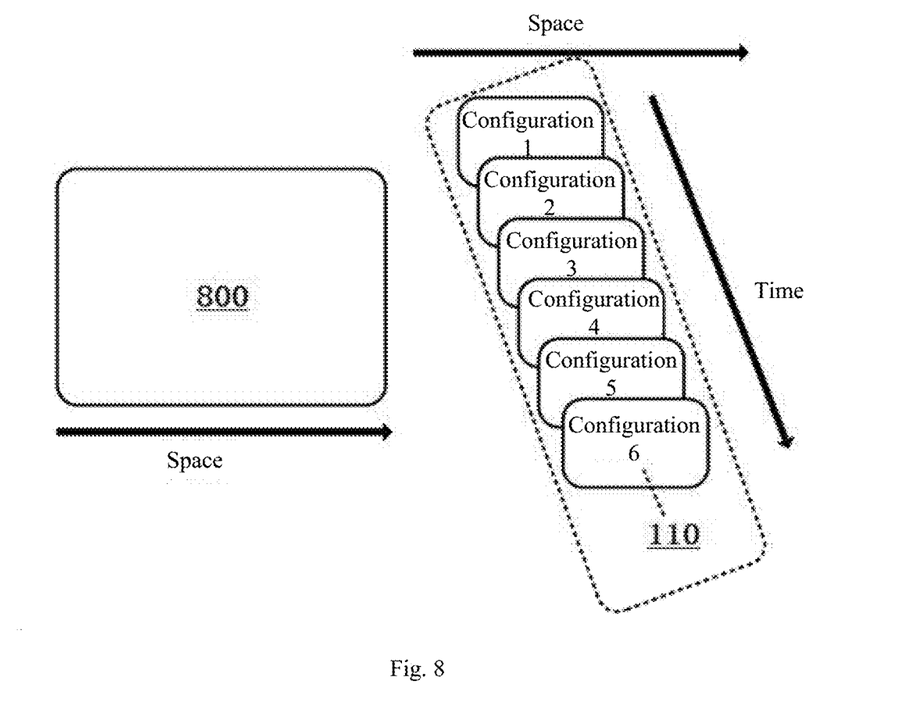
FIG. 8 illustrates an electronic device containing the self-adaptive chip according to some exemplary embodiments of the present disclosure.

FIG. 8 illustrates an electronic device in which the self-adaptive chip of the present disclosure is applied.

As shown in FIG. 8, the electronic device according to some embodiments of the present disclosure may include the self-adaptive chip 100 according to the present disclosure. For example, the electronic device 800 may be a system on programmable chip (SOPC), a mobile terminal, a robot system, etc.

The self-adaptive chip 100 according to the present disclosure is a system which performs conversion between space and time, and can achieve infinite circuit algorithms in a finite chip area by reconfiguring the chip automatically at different time points. The traditional way is to integrate many different applications into a SopC system, which is very large, and needs to use a lot of chip areas, resulting in increased cost and huge power consumption. The self-adaptive chip 100 according to the present disclosure uses a very small chip area, and can realize an infinite chip area in a very small chip area by reconfiguring the chip structure automatically at different time points.

For example, the electronic device 800 according to the embodiment may be used for executing at least a first function and a second function. When the first function is to be executed or being executed, the self-adaptive chip 100 is dynamically configured to execute part or all of the first function. After the first function is executed completely, and when the second function is to be executed or being executed, the self-adaptive chip 110 is dynamically configured to execute part or all of the second function.

The electronic device 800 according to the embodiment may be applied in the fields of aerospace, robot, monitoring, consumer electronics, image processing equipment and the like. In the above fields, the chip can adjust the internal circuit structure thereof according to the needs so as to adapt to different computing requirements and environmental changes.

For example, the chip can accelerate hardware upgrades of satellites in the space, optimize hardware for different tasks, and achieve different space missions. In the field of robots, since the control chip of a traditional robot has a fixed function and cannot realize one-core multi-purpose function, each robot can only be used for a fixed purpose. The self-adaptive chip can make the same robot have different functions, and the functions of the robot can even be downloaded from a network, and executed after being dynamically configured. In the field of consumer electronics, excluding downloading software, mobile phones and computers in the future can also download hardware optimized for the software to dynamically and timely accelerate the software. When accessing the internet via a mobile phone, the network transmission speed can be optimized, a noise filtering function can be configured during calling, and a 3D animation display and optimization function can be configured when playing games. In the large data processing, the self-adaptive chip has great savings in energy consumption while being compared with the traditional cloud computing computer, and the cost will also be greatly reduced. For example, the self-adaptive chip can be automatically optimized into a chip suitable for an image processing acceleration architecture when a camera is started. The self-adaptive chip can conduct image preprocessing on every monitoring camera, perform automatic comparison and alarm for dangerous persons, and realize the reconfiguration of the camera according to the needs.

Figure 9:
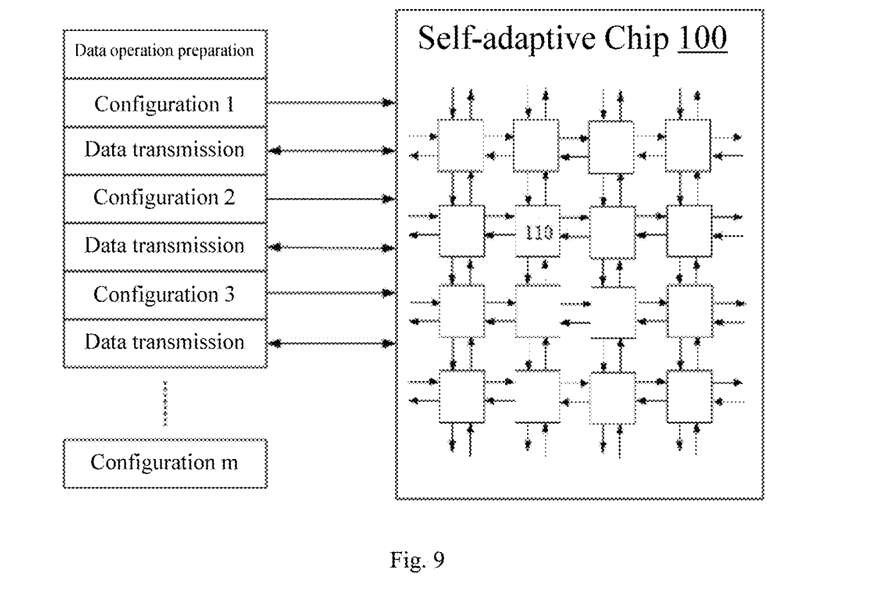
FIG. 9 illustrates a schematic configuration and usage mode of the self-adaptive chip according to some exemplary embodiments of the present disclosure.

FIG. 9 illustrates a schematic configuration and usage mode of the self-adaptive chip according to the present disclosure.

Referring to FIG. 9, the advantages brought by the self-adaptive chip according to the present disclosure will be described by comparing with the data processing of a CPU and an FPGA.

For the CPU, information data to be processed flows through a memory from an input device, and is processed by the CPU. The CPU executes three basic tasks of reading out the data, processing the data, and writing the data into the memory. However, in general, one instruction may contain many operations that are executed in a definite order. The job of the CPU is just to execute these instructions, and each instruction needs several clock cycles. After one instruction is completed, a control cell of the CPU will tell an instruction reader to read a next instruction from the memory for execution. This process is repeated constantly and rapidly, so as to quickly execute the instructions one after another, yielding results such as those seen on a display. When processing so many instructions and data, because of data transfer time difference and CPU processing time difference, the CPU controls every action performed by the CPU through a clock so as to ensure each operation to happen on time. The clock is like a metronome, and constantly pulses to determine the pace and processing time of the CPU which is the master frequency of the CPU that is familiar to us. The higher the main frequency value is, the faster the working speed of the CPU is.

The FPGA adopts such a concept of logic cell array LCA (Logic Cell Array), which internally includes three parts: a configurable logic block CLB (Configurable Logic Block), an input output block IOB (Input Output Block), and an interconnect (Interconnect). The field programmable gate array (FPGA) is a programmable device that has a different structure from the traditional logic circuits and gate arrays (such as PAL, GAL and CPLD devices). In general, the FPGA uses a small lookup table to implement combinatorial logic. Each lookup table is connected to an input terminal of a D trigger, and then the trigger drives other logic circuits or drives I/O, thus forming a basic logic cell block that may both implement a combinatorial logic function and a timing logic function. These blocks are connected to each other by metal wires or connected to the I/O block. The FPGA is based on an ASIC, and uses an LUT mode. The LUT is essentially an RAM, which writes data into the RAM in advance, every time a signal is inputted, it is equivalent to entering an address to look up the table so as to find contents corresponding to the address, and then output the contents. The FPGA allows the chip structure to be reconfigured in a static state, and even be reconfigured in a locally dynamic state, and has an obvious advantage over the ASIC on the time-to-market. However, a designed circuit still needs to be programmed into the chip in general. The application cost of the FPGA for a small quantity is relatively low, but is relatively high for a large quantity.

The self-adaptive chip 100 according to the present disclosure is a brand new framework that enables the direct transformation from any software algorithm to the chip structure. The LUT structure adopted in the FPGA suffers from a large amount of configuration data in terms of dynamic reconfigurability, so the dynamic reconfiguration speed of the FPGA is difficult to be improved, and can only reach a millisecond level. However, in the self-adaptive chip according to the present disclosure, the chip can be dynamically re-erased, thus all the logic cells can be re-used, the logic cells become infinite, and are not limited any longer. The self-adaptive chip according to the present disclosure is only limited by a re-erasing speed, and is not limited by the capacity.

It is assumed that there are a units of data tasks needing to be processed in the embodiment as shown in FIG. 9.

If the CPU scheme is adopted, the algorithm for processing the data of one unit needs n clocks, and the duration for completing the a units of data tasks is a*n.

If the FPGA scheme is adopted, the algorithm for processing the data of one unit needs one clock, and the duration for completing the a units of data tasks is a.

Referring to FIG. 9 which illustrates a processing procedure of the self-adaptive chip 100 according to the present disclose, the self-adaptive chip 100 is automatically configured by a processor. The algorithm of the self-adaptive chip for processing the data of one unit is one clock, m configurations are needed to complete the data tasks of a units, and the duration for completing the data tasks of a units is (a*m)+configuration time. In a specific operation, the configuration time is far away from the magnitude of a*m, and may be substantially negligible.

Therefore, from the processing time, a<a*m<a*n, i.e., the efficiencies of processing the data tasks of a units from high to low are sequentially are: the FPGA, the self-adaptive chip, and the CPU. However, with the increase of the data processing amount, the chip area of the FPGA is increased and the cost is improved significantly. Therefore, the FPGA cannot be infinite, and is constrained for large and medium-sized data processing and computing. However, all the logic cells can be reused since the self-adaptive chip according to the present disclosure can be reconfigured dynamically. Therefore, the logic cells become infinite, are not limited any longer, and are suitable for large and medium-sized data processing. The self-adaptive chip according to the present disclosure has incomparable advantages on the aspects of processing efficiency and cost control.

Figure 10:
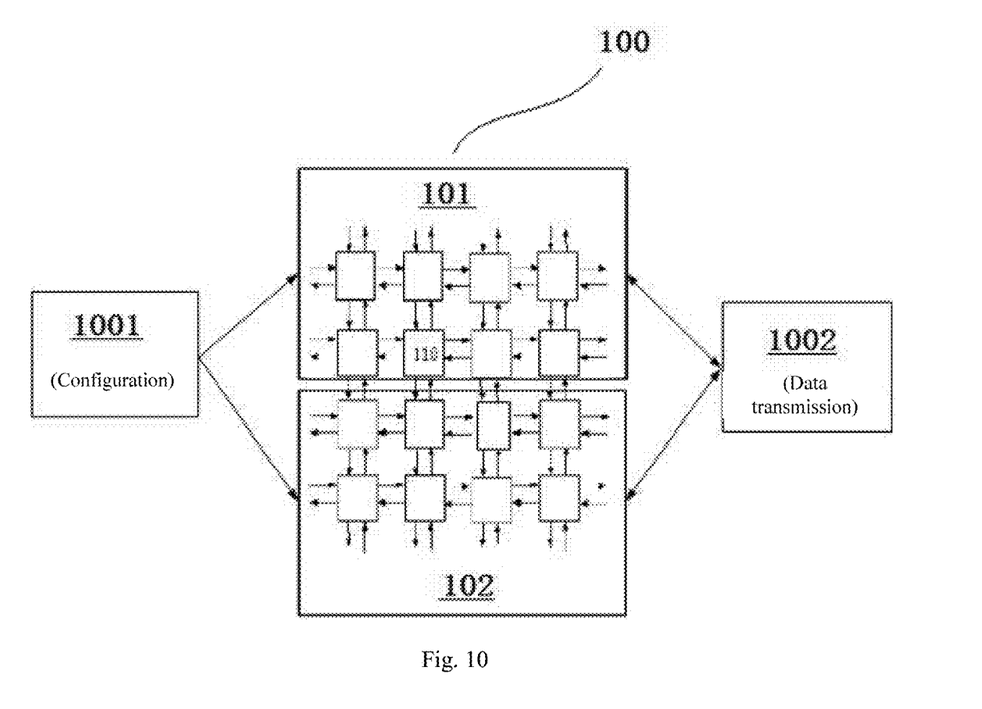
FIG. 10 illustrates a schematic configuration and usage mode of the self-adaptive chip according to some exemplary embodiments of the present disclosure.

FIG. 10 illustrates a schematic configuration and usage mode of the self-adaptive chip according to present disclosure.

The self-adaptive chip 100 according to the present disclosure may be divided into at least two operation regions, and the at least two operation regions are configured and performs operations in parallel, so as to implement parallelization processing. For instance, one operation region is used for the configuration, and the other operation region is used for calculation. The operation regions can be switched immediately after the completion of the configuration. The operation region used for calculation originally may be changed to be used for reconfiguration, while the operation region which is just configured may be directly inputted with data for calculation. The switching time is very short and may be controlled at a nanosecond time level. Therefore, synchronous configuration and operation can be implemented, moreover, the time for switching configuration can reach a nanosecond level after the operation is completed, thus greatly improving the data processing capacity.

As shown in FIG. 10, the self-adaptive chip 100 according to the embodiment is used in conjunction with a dual-core processor. Each core of the processor adopts a single-instruction manner to execute instructions, and only one instruction may be executed at a time. The inside of the self-adaptive chip is provided with an operation region 101 and an operation region 102, and one of the regions is configured by one core 1001 of a multi-core processor; after the configuration is completed, the other core 1002 of the processor distributes big data to one part of the self-adaptive chip that is completely configured to perform operation, while the core 1001 of the processor responsible for configuration may continuously configure the other part of the self-adaptive chip. When the big data operation of one part is completely processed, a new region of the self-adaptive chip may be switched to for processing new data. This method can achieve one-core multiple-purpose, process data in parallel, and greatly improve the speed. The inside of the self-adaptive chip may also be provided with multiple operation regions, and the principle is the same as that of this embodiment.

Figure 11:
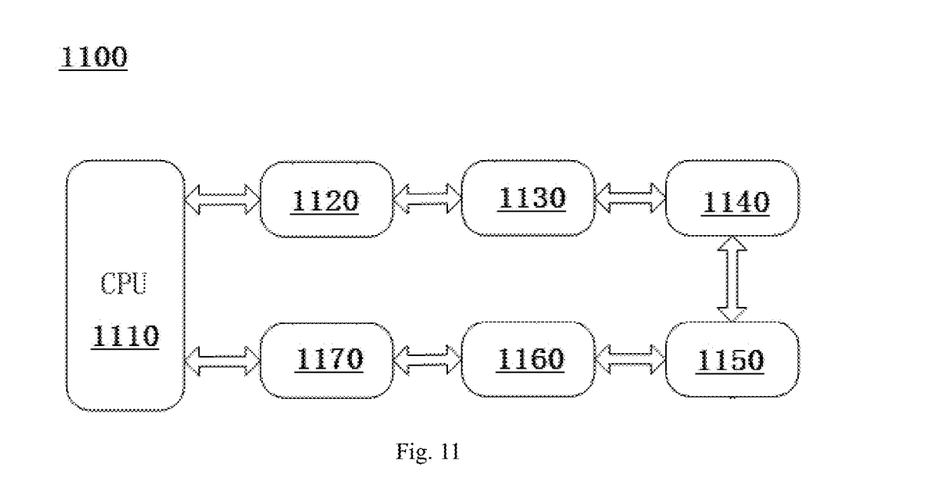
FIG. 11 illustrates a schematic configuration and usage mode of the self-adaptive chip according to some exemplary embodiments of the present disclosure.
Figure 12:
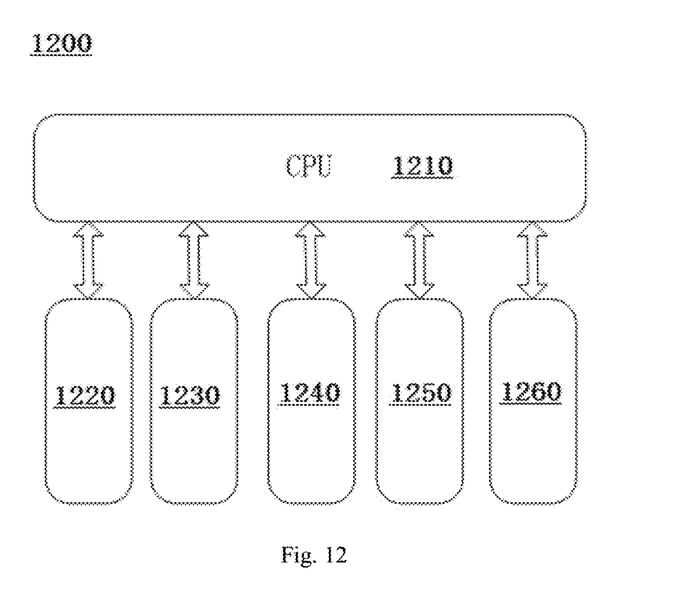
FIG. 12 illustrates a schematic configuration and usage mode of the self-adaptive chip according to some exemplary embodiments of the present disclosure.

FIGS. 11 and 12 illustrate a schematic configuration and usage mode of the self-adaptive chip according to the present disclosure.

When processing and operating the data of some big data occasions, for example, the self-adaptive chips of the present disclosure may be used in series or in parallel. Referring to FIG. 11, multiple self-adaptive chips 1120-1170 are used in series to increase the available area in each time when a CPU 1110 is used for reconfiguration. Referring to FIG. 12, multiple self-adaptive chips 1220-1260 are used in parallel, and may be reconfigured by using a CPU 1210. The multiple self-adaptive chips may process data at the same time, thus greatly increasing the processing speed.

In conclusion, the self-adaptive chip according to the embodiments of the present disclosure has one or more of the following advantages.

First, the self-adaptive chip is provided with several basic cells (dynamically reconfigurable cells). Each basic cell registers configuration data, and is connected to the neighboring basic cell. When data is transferred in, different input channels are selected according to the configuration and operations are performed, and the operation results are sent to the neighboring basic cells. Therefore, the present disclosure provides a novel chip, which can be dynamically reconfigured, and can implement infinite circuit algorithms in a limited chip area by reconfiguring the chip automatically at different time points. Moreover, the internal structure of the chip can be adjusted automatically according to different application requirements, so as to implement dynamic reconfiguration, an infinite chip area, less power consumption and low cost.

Second, the self-adaptive chip, which is based on the brand new framework, can quickly enable the direct transformation from the software algorithm to the chip structure, and has obvious advantages over the FPGA adopting the LUT structure. The FPGA suffers from a large amount of configuration data in terms of dynamic reconfigurability, so the dynamic reconfiguration speed of the FPGA is difficult to improve, and can only reach a millisecond level. The self-adaptive chip according to the present disclosure does not employ the LUT structure, and can implement fast dynamic reconfiguration. All the logic cells can be reused since the chip can be dynamically re-erased, so that the basic cells become infinite, and will not be limited any longer. The self-adaptive chip is only limited by a re-erasing speed, and is not limited by the capacity.

Third, the self-adaptive chip can implement synchronous application, development and upgrade, so that the cost is reduced. In this way, the hardware can be downloaded as software, allowing the hardware to be upgraded automatically.

Fourth, the self-adaptive chip can conduct configuration and operation by regions, and implement synchronous configuration and operation; moreover, the time for switching configuration after the operation is completed can reach a nanosecond level. If the traditional SOC is equivalent to an analog world, then the self-adaptive chip is just a digital world. When digital sampling is fast enough, that is, the switching of the self-adaptive chip is fast enough, an analog signal can be approximately restored, that is, the area of an integrated circuit is infinite.

Fifth, during configuration, only the configuration parameter values similar to an image pixel structure need to be transmitted into the chip; and there is no need to change the basic cell of the configuration or perform mass data transmission because only dozens of bits are needed to configure one cell. Therefore, the time is saved. Meanwhile, the configuration contents are quite few, and therefore, the transmission time is very short.

The above descriptions are merely exemplary embodiments of the disclosure, but are not to limit the scope of the embodiments of the disclosure, i.e., modifications or additions made according to the teaching of the disclosure shall still fall within the scope of the disclosure.

Other embodiment solutions of the present disclosure will readily occur to those skilled in the art upon consideration of the description and practice of the disclosure herein. This application is intended to cover any variations, uses, or adaptations of the disclosure. These variations, uses or adaptations follow the general principles of the disclosure, and include the known or customary practice in the prior art that are not recorded in the disclosure. The description and embodiments are only exemplary, and the scope and spirit of the disclosure are limited by the claims.

What is claimed is:

1. A self-adaptive chip, comprising:
   a plurality of dynamically reconfigurable cells arranged in an array, each of the plurality of dynamically reconfigurable cells being capable of being dynamically reconfigured as needed to execute different operating functions and/or input-output control functions,
   wherein each of the plurality of dynamically reconfigurable cells is connected to multiple neighboring dynamically reconfigurable cells to directly acquire data from one or more of the multiple neighboring dynamically reconfigurable cells and to output an operation result, generated from the data, directly to at least one neighboring dynamically reconfigurable cell;

wherein each of the plurality of dynamically reconfigurable cells comprises an arithmetic logic time cell, the arithmetic logic time cell being configured to perform operations comprising an arithmetic operation, a logical operation, an empty operation, and counting, and wherein each of the plurality of dynamically reconfigurable cells is connected to six to eight neighboring dynamically reconfigurable cells.

2. The self-adaptive chip according to claim 1, wherein each of the plurality of dynamically reconfigurable cells implements a software algorithm function by being configured into a corresponding circuit structure.

3. The self-adaptive chip according to claim 1, wherein each of the plurality of dynamically reconfigurable cells further comprises: a memory/register, an input controller and an output controller.

4. The self-adaptive chip according to claim 1, wherein the arithmetic logic time cell is configured to execute different operating functions according to instructions.

5. The self-adaptive chip according to claim 4, wherein an execution cycle of each of the instructions is at least one clock.

6. The self-adaptive chip according to claim 4, wherein the self-adaptive chip is configured to implement a cascade of operations through a cascade of the dynamically reconfigurable cells to implement more instructions.

7. The self-adaptive chip according to claim 3, wherein the arithmetic logic time cell comprises: a clock input terminal, a reset terminal, a plurality of instruction input terminals, a plurality of operation input terminals, and a plurality of operation output terminals.

8. The self-adaptive chip according to claim 7, wherein the output controller is configured to output data from the plurality of operation output terminals to at least one of the multiple neighboring dynamically reconfigurable cells in at least one of a single manner and a combined manner.

9. The self-adaptive chip according to claim 7, wherein the memory/register is used for registering an instruction, an operand, and configuration data of the input controller, and the configuration data is used for controlling a data source of the input controller.

10. The self-adaptive chip according to claim 9, wherein the memory/register is provided with independent data channels for respectively inputting, from a top level, an operating instruction, the configuration data of the input controller, and registerable operation data.

11. The self-adaptive chip according to claim 1, wherein the self-adaptive chip implements an algorithm of serial operation in a pipeline or parallel manner.

12. The self-adaptive chip according to claim 1, wherein the self-adaptive chip comprises an address input terminal and an address control cell, and wherein the address control cell selects one of the plurality of dynamically reconfigurable cells through the address input terminal to perform configuration.

13. The self-adaptive chip according to claim 1, wherein the self-adaptive chip is configured to perform a process, the process comprising: (i) after being configured for one time, performing an operation according to inputted data; (ii) upon completion of (i), erasing and reconfiguring the self-adaptive chip, and then performing a new operation according to newly inputted data; and repeating (i) and (ii).

14. The self-adaptive chip according to claim 1, wherein the self-adaptive chip is divided into at least two operation regions, and wherein the at least two operation regions are configured and perform the operation in parallel to implement a parallel processing.

15. The self-adaptive chip according to claim 1, wherein the arithmetic logic time cell is further configured to perform a timing delay.

16. A configuration method for a self-adaptive chip, wherein the self-adaptive chip comprises:
a plurality of dynamically reconfigurable cells arranged in an array, each of the plurality of dynamically reconfigurable cells being capable of being dynamically reconfigured as needed to execute different operating functions and/or input-output control functions,
wherein each of the plurality of dynamically reconfigurable cells is connected to multiple neighboring dynamically reconfigurable cells to directly acquire data from one or more of the multiple neighboring dynamically reconfigurable cells and to output an operation result, generated from the data, directly to at least one neighboring dynamically reconfigurable cell,
wherein each of the plurality of dynamically reconfigurable cells comprises an arithmetic logic time cell, and the arithmetic logic time cell being configured to perform operations comprising an arithmetic operation, a logical operation, an empty operation, and counting, and
wherein each of the plurality of dynamically reconfigurable cells is connected to six to eight neighboring dynamically reconfigurable cells, and
wherein the method comprises:
defining a plurality of configurations respectively used for the plurality of dynamically reconfigurable cells, each of the plurality of configurations comprising at least one configuration parameter value; and
writing the plurality of configurations into corresponding plurality of dynamically reconfigurable cells respectively.

17. The configuration method according to claim 16, wherein the step of defining the plurality of configurations respectively used for the plurality of dynamically reconfigurable cells comprises: compiling a predetermined instruction into a structure comprising the plurality of dynamically reconfigurable cells, each dynamically reconfigurable cell being configured to complete at least one operation.

18. The configuration method according to claim 16, wherein the step of writing the plurality of configurations into the corresponding plurality of dynamically reconfigurable cells respectively comprises: selecting one of the plurality of dynamically reconfigurable cells and writing the at least one configuration parameter value of the corresponding configuration into one of the plurality of dynamically reconfigurable cells.

19. An electronic device for executing at least a first function and a second function, comprising a self-adaptive chip, wherein the self-adaptive chip comprises:
a plurality of dynamically reconfigurable cells arranged in an array, each of the plurality of dynamically reconfigurable cells being capable of being dynamically reconfigured as needed to execute different operating functions and/or input-output control functions,
wherein each of the plurality of dynamically reconfigurable cells is connected to multiple neighboring dynamically reconfigurable cells to directly acquire data from one or more of the multiple neighboring dynamically reconfigurable cells and to output an operation result, generated from the data, directly to at least one neighboring dynamically reconfigurable cell, wherein each of the plurality of dynamically reconfigurable cells comprises an arithmetic logic time cell, and the arithmetic logic time cell being configured to perform operations comprising an arithmetic operation, a logical operation, an empty operation, and counting, wherein each of the plurality of dynamically reconfigurable cells is connected to six to eight neighboring dynamically reconfigurable cells, and wherein:
  when the first function is to be executed or being executed, the self-adaptive chip is dynamically configured for executing part or all of the first function; and
  when the first function is completely executed and when the second function is to be executed or being executed, the self-adaptive chip is dynamically configured for executing part or all of the second function.

* * * * *